United States Patent
Mittendorf

(10) Patent No.: US 8,535,005 B2
(45) Date of Patent: Sep. 17, 2013

(54) BLADES, TURBINE BLADE ASSEMBLIES, AND METHODS OF FORMING BLADES

(75) Inventor: Don Mittendorf, Mesa, AZ (US)

(73) Assignee: Honeywell International Inc., Morristown, NJ (US)

(*) Notice: Subject to any disclaimer, the term of this patent is extended or adjusted under 35 U.S.C. 154(b) by 764 days.

(21) Appl. No.: 12/771,789

(22) Filed: Apr. 30, 2010

(65) Prior Publication Data
US 2011/0268584 A1    Nov. 3, 2011

(51) Int. Cl.
*F01D 5/18*    (2006.01)

(52) U.S. Cl.
USPC ...... 416/97 R; 416/224; 416/232; 416/241 R; 416/243; 416/223 A; 9/889.21; 9/889.22

(58) Field of Classification Search
USPC .............. 416/223 R, 224, 232, 241 R, 243, 416/223 A, 97 R; 29/889.21, 889.22
See application file for complete search history.

(56) References Cited

U.S. PATENT DOCUMENTS

| | | | |
|---|---|---|---|
| 4,492,522 A * | 1/1985 | Rossmann et al. | 416/241 R |
| 4,828,933 A | 5/1989 | McGill et al. | |
| 5,288,205 A | 2/1994 | Jones | |
| 5,437,933 A | 8/1995 | Coupland et al. | |
| 5,906,895 A | 5/1999 | Hamada et al. | |
| 5,997,248 A * | 12/1999 | Ghasripoor et al. | 416/241 R |
| 6,502,304 B2 * | 1/2003 | Rigney et al. | 29/889.21 |
| 6,616,410 B2 * | 9/2003 | Grylls et al. | 416/224 |
| 6,755,619 B1 | 6/2004 | Grylls et al. | |
| 6,933,052 B2 | 8/2005 | Gorman et al. | |
| 7,316,850 B2 * | 1/2008 | Hu et al. | 416/241 R |
| 2005/0112398 A1 | 5/2005 | Darolia et al. | |
| 2008/0304975 A1 * | 12/2008 | Clark et al. | 416/241 R |
| 2008/0311306 A1 | 12/2008 | Xiao et al. | |

* cited by examiner

*Primary Examiner* — Igor Kershteyn
(74) *Attorney, Agent, or Firm* — Ingrassia Fisher & Lorenz, P.C.

(57) ABSTRACT

Blades, turbine blade assemblies, and methods of forming blades are provided. The blade includes an airfoil including a convex suction side wall, a concave pressure side wall, a leading edge, a trailing edge, a root, and a tip, the convex suction side wall, the concave pressure side wall, and the tip each including interior surfaces that together define an internal cooling circuit, the airfoil including a single crystal superalloy, and a cladding layer disposed over the tip, the cladding layer including a zirconia grain stabilized platinum alloy.

19 Claims, 3 Drawing Sheets

BLADES, TURBINE BLADE ASSEMBLIES, AND METHODS OF FORMING BLADES

TECHNICAL FIELD

The inventive subject matter generally relates to turbines, and more particularly relates to turbine blades and assemblies.

BACKGROUND

Gas turbine engines, such as turbofan gas turbine engines, may be used to power various types of vehicles and systems, such as aircraft. Typically, these engines include turbines that rotate at a high speed when blades (or airfoils) extending therefrom are impinged by high-energy compressed air. Consequently, the blades are subjected to high heat and stress loadings which, over time, may reduce their structural integrity.

To improve blade structural integrity, a blade cooling scheme can be included to provide active cooling of the blade and to maintain the blade temperatures within acceptable limits. In some cases, the blade cooling scheme directs cooling air through an internal cooling circuit formed in the blade. The internal cooling circuit may include a simple channel extending through a length of the blade or may consist of a series of connected, serpentine cooling passages, which incorporate raised or depressed structures therein. The serpentine cooling passages increase the cooling effectiveness by extending the length of the air flow path. In this regard, the blade may have multiple internal walls that form intricate passages through which the cooling air flows to feed the serpentine cooling passages.

As the desire for increased engine efficiency continues to rise, engine components are increasingly being subjected to higher and higher operating temperatures. For example, newer engine designs may employ operating temperatures that produce turbine blade tip temperatures that exceed 1150° C. which may be 140° C. hotter than blade tip operating temperatures of current engines. However, current engine components, such as tips or parapets (also known as "tip cap") of the blade, may not be adequately designed to withstand such temperatures over time. In particular, the tips or parapets of the blade may not include active cooling and may become hotter than surrounding portions of the blade. Hence, designs for improving the blades may be desired.

Accordingly, it is desirable to have an improved turbine blade that is suitable for use in operating temperatures greater than 1150° C. In addition, it is desirable for the improved turbine blade to be relatively simple and inexpensive to manufacture. Furthermore, other desirable features and characteristics of the inventive subject matter will become apparent from the subsequent detailed description of the inventive subject matter and the appended claims, taken in conjunction with the accompanying drawings and this background of the inventive subject matter.

BRIEF SUMMARY

Blades, turbine blade assemblies, and methods of forming blades are provided.

In an embodiment, by way of example only, a blade includes an airfoil including a convex suction side wall, a concave pressure side wall, a leading edge, a trailing edge, a root, and a tip, the convex suction side wall, the concave pressure side wall, and the tip each including interior surfaces that together define an internal cooling circuit, the airfoil comprising a single crystal superalloy, and a cladding layer disposed over the tip, the cladding layer a comprising a zirconia grain stabilized platinum alloy.

In another embodiment, by way of example only, a turbine blade assembly includes a turbine including a hub and a plurality of blades extending from the hub and a shroud disposed around the turbine. Each blade includes an airfoil including a convex suction side wall, a concave pressure side wall, a leading edge, a trailing edge, a root, and a tip, the convex suction side wall, the concave pressure side wall, and the tip each including an interior surface defining an internal cooling circuit, the airfoil comprising a single crystal superalloy, and a cladding layer disposed over the tip, the cladding layer comprising a zirconia grain stabilized platinum alloy.

In still another embodiment, by way of example only, a method for forming a blade includes disposing a cladding layer over a tip of a blade airfoil, the cladding layer having an initial thickness and comprising a zirconia grain stabilized platinum alloy, and the blade airfoil comprising a single crystal superalloy, and machining the cladding layer to a final desired thickness.

BRIEF DESCRIPTION OF THE DRAWINGS

The inventive subject matter will hereinafter be described in conjunction with the following drawing figures, wherein like numerals denote like elements.

DETAILED DESCRIPTION

The following detailed description is merely exemplary in nature and is not intended to limit the inventive subject matter or the application and uses of the inventive subject matter. Furthermore, there is no intention to be bound by any theory presented in the preceding background or the following detailed description.

An improved blade is provided that may be implemented into components subjected to temperatures of 1150° C. or greater. The blade includes a tip to which a cladding layer may be diffusion bonded. The cladding layer is formulated to provide creep-resistance to the blade and, in this regard, may be formed from a platinum alloy. A suitable platinum alloy includes, but is not limited to, a zirconia grain stabilized platinum alloy. The improved blade may be incorporated into first stage turbine assemblies or in any other sections of an engine. Although described as being implemented a part of a turbofan gas turbine engine, the blade alternatively may be included in other types of engines.

Figure 1:
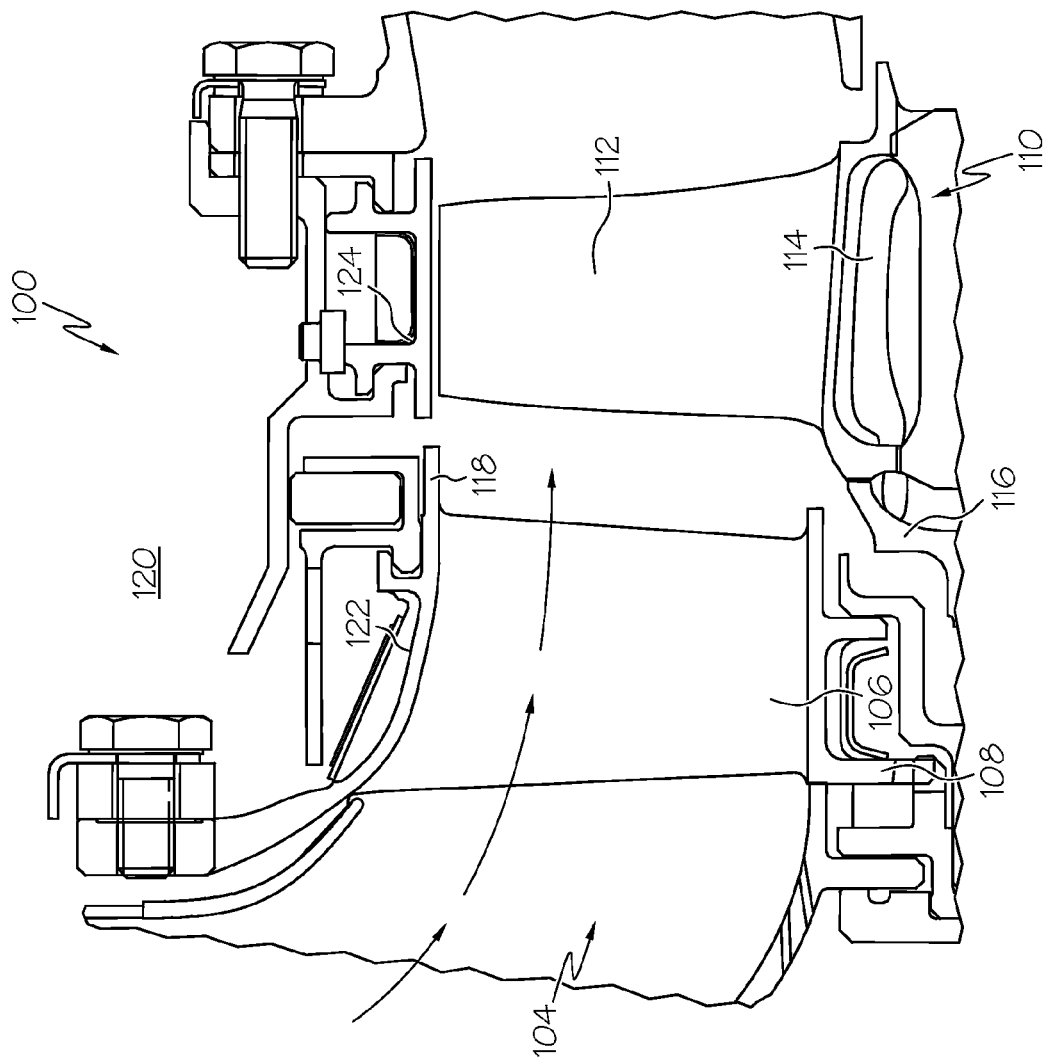
FIG. 1 is a cross-sectional side view of a portion of a turbine section of an engine, according to an embodiment.

FIG. 1 is a cross-sectional side view of a portion of a turbine section 100 of an engine, according to an embodiment. The turbine section 100 receives high temperature gases (e.g., gases having a temperature greater than 1100° C.) from an upstream engine combustor (not shown) to produce energy for the engine and/or components coupled to the engine. In an embodiment, the turbine section 100 includes a turbine nozzle 104 that has a plurality of static vanes 106 mounted circumferentially around a ring 108. The static vanes 106 direct the gases from the combustor to a turbine rotor 110. According to an embodiment, the turbine rotor 110 includes a plurality of blades 112 (only one of which is shown) that are attached to a hub 114 and retained in axial position by a retention plate 116. When the blades 112 are impinged upon by the gases, the gases cause the turbine rotor 110 to spin. According to an embodiment, an outer circumferential wall 118 surrounds the static vanes 106 and the plurality of blades 112 to define a flowpath 122. The outer circumferential wall 118 can include a first annular section 122 disposed around the static vanes 106 and a shroud 124 surrounding the plurality of blades 112, in an embodiment. The outer circumferential wall 118 defines a portion of a compressor discharge plenum 120 that is disposed radially outwardly relative to the flowpath 122. The compressor discharge plenum 120 receives bleed air from a compressor section (not shown), which may be directed through one or more openings in the outer circumferential wall 118 towards the plurality of blades 112 to cool the blades 112.

Figure 2:
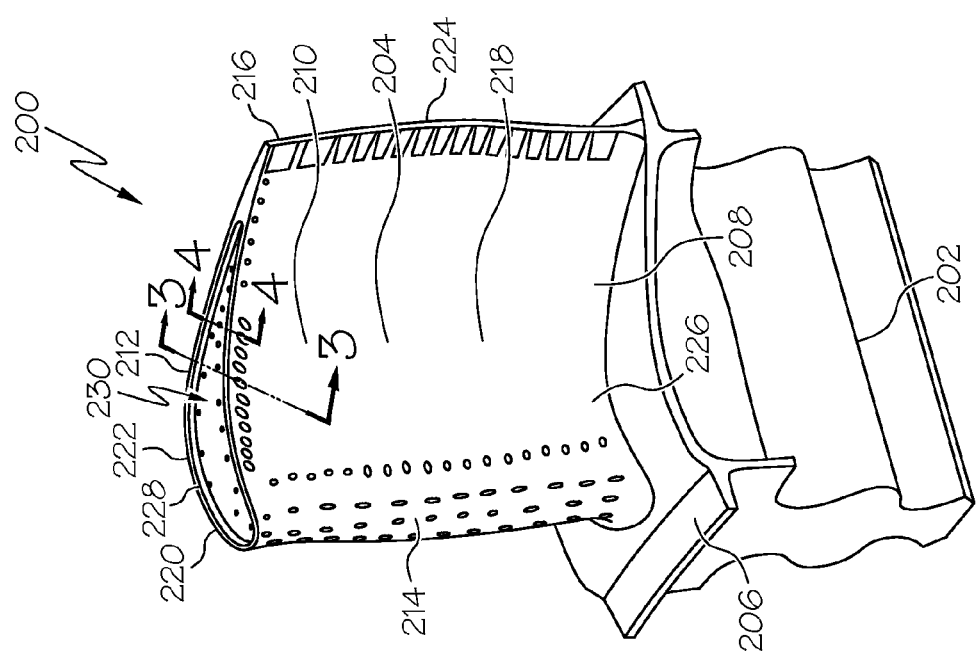
FIG. 2 is a perspective view of a blade, according to an embodiment.

FIG. 2 is a perspective view of a blade 200, according to an embodiment. The blade 200 may be implemented into a turbine rotor (e.g., turbine rotor 110 in FIG. 1) and includes a blade attachment section 202, an airfoil 204, and a platform 206. The blade attachment section 202 provides an area in which a shape is machined. In an embodiment, the shape corresponds with a shape formed in a respective blade attachment slot (not shown) of the turbine hub (e.g., hub 114 in FIG. 1). For example, in some embodiments, the shape may be a firtree shape. In other embodiments, the shape may be a beveled shape. However, in other embodiments, any one of numerous other shapes suitable for attaching the blade 200 to the turbine may be alternatively machined therein.

The airfoil 204 has a root 208 and two outer walls 210, 212. The root 208 is attached to the platform 206 and is integrally formed with each outer wall 210, 212. The outer walls 210, 212 have outer surfaces that define an airfoil shape. The airfoil shape includes a leading edge 214, a trailing edge 216, a pressure side 218 along the first concave outer wall 210, a suction side 220 along the second convex outer wall 212, a tip 222, a pressure side discharge trailing edge slot 224, and an airfoil platform fillet 226. The tip 222 serves as a wall that extends between t the concave pressure side wall 210 and the convex suction side wall 212. In an embodiment, a parapet 228 extends from the tip 222 to form a well 230 with a top surface of the tip 222. In this regard, the parapet 228 may be configured to extend substantially parallel to the concave pressure side wall 210 and the convex suction side wall 212 beyond the tip 222 a particular height. In an example, the parapet 228 extends an entire length of one or both of the concave pressure side wall 210 and the convex suction side wall 212. In other examples, the parapet 228 may extend a portion of the lengths of one or both of the concave pressure side wall 210 and the convex suction side wall 212. The parapet 228 may have height in a range of about 0.38 mm to about 1.14 mm, in an embodiment. In other embodiments, the height may be greater or less than the aforementioned range. Although depicted as substantially uniform in height, the parapet 228 may be shorter at some locations than at others.

Though not shown, the blade 200 may be actively cooled by an internal cooling circuit formed therein. The internal cooling circuit may extend from an opening in the platform 206 through the blade 200 and may include various passages that eventually communicate with the trailing edge slot 224 or other openings that may be formed in the blade 200. In particular, the convex suction side wall 212, the concave pressure side wall 210, and the tip 222 each include interior surfaces defining the internal cooling circuit.

To provide structural integrity during exposure to extremely high temperatures (e.g., temperatures of 1100° C. or greater), the blade 200 comprises a single crystal superalloy material. A "single crystal superalloy material" may be defined as a superalloy material formed to have a single crystallographic orientation throughout its entirety and to be substantially free of high angle boundaries. In some embodiments, an incidental amount of low angle boundaries, which are commonly defined as the boundaries between adjacent grains whose crystallographic orientation differs by less than about 5 degrees, such as tilt or twist boundaries, may be present within the single crystal superalloy material after solidification and formation of the single crystal superalloy material, or after some deformation of the component during creep or other deformation process. However, preferably, low angle boundaries are not present in the single crystal superalloy component.

The single crystal superalloy material may be composed of, but is not limited to, a base material, such as a nickel-based superalloy, in an embodiment. Suitable nickel-based superalloys include, but are not limited to, MAR-M-247EA, MAR-M-247DS or SC180. In other embodiments, the blade 200 may comprise a different base material, such as a cobalt-based superalloy. According to an embodiment, the blade 200 may be cast as an equiaxed, directionally solidified, or single crystal blade.

The blade 200 includes one or more coatings to reduce thermal mechanical fatigue resulting from cyclic and prolonged exposure to the high temperatures. According to an embodiment, an entirety of the blade 200 can be substantially uniformly covered with one or more coatings. In another embodiment, certain portions of the blade 200 include different coatings tailored to provide particular desired properties to the blade 200. For example, the pressure side wall 210 and the suction side wall 212 may include a first set of coatings formulated to provide oxidation resistance properties and to form a thermal conductivity barrier for maintaining temperatures low in concert with the temperature of the cooling gas flowing through the internal cooling circuit, while the tip 222 includes a second set of coatings formulated primarily to provide creep resistance properties as well as oxidation resistance.

Figure 4:
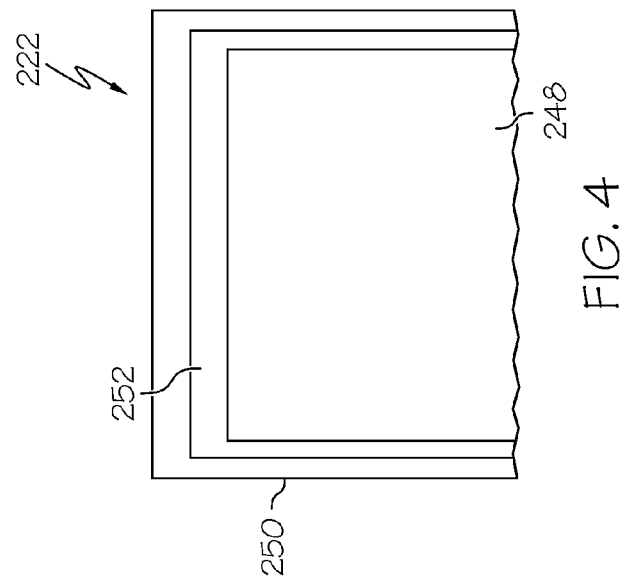
FIG. 4 is a cross section view of a tip of the blade of FIG. 2 taken along line 4-4, according to an embodiment.
Figure 3:
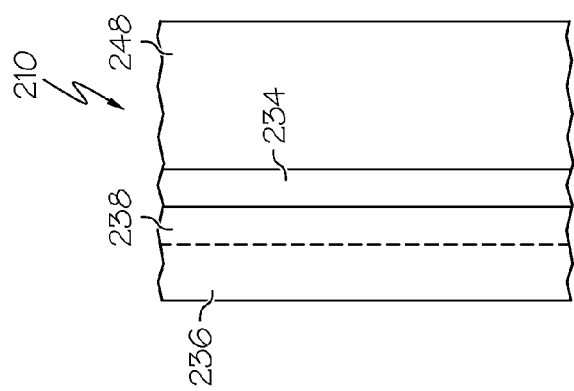
FIG. 3 is a cross section view of a side wall of the blade of FIG. 2 taken along line 3-3, according to an embodiment.

FIGS. 3 and 4 are cross section views of the pressure side wall 210 of the blade 200 of FIG. 2 taken along line 3-3 and the tip 222 of the blade 200 of FIG. 2 taken along line 4-4, according to an embodiment. With reference to FIG. 3, the pressure side wall 210 may include a bond coating 234, a thermal barrier coating 236, and one or more intermediate layers 238 (shown in phantom). Although the coatings and layers 234, 236, 238 are described in conjunction with the pressure side wall 210, it will be appreciated that the same may be applied to the suction side wall 212 and other portions of the blade 200, including but not limited to the leading edge 214 and the trailing edge 216 of the blade 200.

In any case, the coatings and layers 234, 236, 238 are disposed over a base material 248. The base material 248 is selected from one or more of the single crystal superalloy material mentioned previously. In an embodiment, the bond coating 234 is included to provide improved adherence of the thermal barrier coating 236 to the base material 248. In accordance with an embodiment, the bond coating 234 comprises a diffusion aluminide coating that is formed by depositing an aluminum layer over the component blade, and by interdiffusing the aluminum layer with the superalloy substrate. In one embodiment, the bond coating is a simple diffusion aluminide. In another embodiment, the bond coating is a more complex diffusion aluminide that includes other metallic layers. In an embodiment, the other metallic layer is a platinum layer. In another embodiment, the other metallic layer is a hafnium and/or a zirconium layer. In yet another embodiment, the other metallic layer is a co-deposited hafnium, zirconium, and platinum layer. In another exemplary embodiment, the bond coating 234 is an overlay coating known as an MCrAlX coating, wherein M is cobalt, nickel, or combinations thereof. The X is hafnium, zirconium, yttrium, tantalum, rhenium, ruthenium, palladium, platinum, silicon, or combinations thereof. Some examples of MCrAlX compositions include NiCoCrAlY and CoNiCrAlY. In another exemplary embodiment, the bond coating 234 is a combination of two types of bond coatings, a diffusion aluminide coating formed on an MCrAlX coating.

The thermal barrier coating 236 protects the blade 200 from the extremely high temperatures. Thermal barrier coating 236 may comprise, for example, a partially stabilized zirconia-based thermal barrier coating, such as yttria stabilized zirconia (YSZ). As alluded to above, intermediate layers 238 may be included between the bond coating 234 and the thermal barrier coating 236. The thermal barrier coating 236 is not included over the tip 222, in an embodiment. The intermediate layers 238 can be formulated to reduce the effect of impurities in the bond coating 234 and to minimize the growth of oxides on the bond coating 234 to thereby improve the adherence of the thermal barrier coating 236 to the bond coating 234 and reduce thermal mismatch stress due to growth of an alumina scale.

To provide thermal protection properties to the tip 222 that are different from those of the walls 210, 212, the tip 222 comprises the base material 248 and a cladding layer 250, as shown in FIG. 4. The base material 248 is formed from the single crystal superalloy material mentioned above in relation to the blade 200 and includes the cladding layer 250 disposed thereover, in an embodiment. The cladding layer 250 is formulated to have improved creep resistance and stress properties over those of the base material 248 as portions of the tip 222, such as the parapet 224, may not be actively cooled by the internal cooling circuit resulting in undesirably higher temperatures and may be more susceptible to unwanted deformation resulting from creep. In an embodiment, the cladding layer 250 comprises a platinum alloy having a coefficient of thermal expansion that is lower than a coefficient of thermal expansion of the base material 248. In this way, the ZGS platinum alloy of the cladding layer 250 maintains structural integrity at temperatures above 1150° C., while the base material 248 resists creep at the cooled lower temperatures. Additionally, at temperatures above 1150° C., the ZGS platinum alloy of the cladding layer 250 protects the base material 248 from deformation to resist creeping, due to the lower coefficient of thermal expansion of the ZGS platinum alloy. Specifically, the ZGS platinum alloy does not expand as quickly as the base material 248 and, thus does not impart as much of a strain on the base material as compared to other materials at the elevated temperatures.

Generally, ZGS platinum alloys are oxide dispersion strengthened (ODS) and include up to about 1.0%, by weight, of zirconium oxide or zirconium oxide and yttrium oxide. The zirconium oxide and/or yttrium oxide are substantially evenly and finely dispersed throughout the platinum alloy and act as impermeable barriers to dislocation to thereby increase resistance to creep at high temperatures. In another embodiment, the ODS ZGS platinum alloys may comprise one or more additional elements, including but not limited to rhodium, iridium, aluminum, chromium, ruthenium, cobalt, and nickel. According to an embodiment, the one or more additional elements may be present at about 10% by weight. The one or more additional elements can also increase creep resistance by solid solution strengthening or by the forming intermetallic precipitates. The cladding layer 250 has a thickness in a range of about 0.1 mm to about 0.7 mm, in an embodiment. In other embodiments, the cladding layer 250 may be thicker or thinner than the aforementioned range.

A bond coating 252 may be included between the cladding layer 250 and the base material 248 to provide improved adhesion of the cladding layer 250 to the base material 258, in an embodiment. In this regard, the bond coating 252 may be formed from a noble metal, including but not limited to platinum, palladium, and ruthenium. The bond coating 252 has a thickness in a range of about 0.006 mm to about 0.05 mm, in an embodiment. In another embodiment, the bond coating 252 may be thicker or thinner than the aforementioned range.

Figure 5:
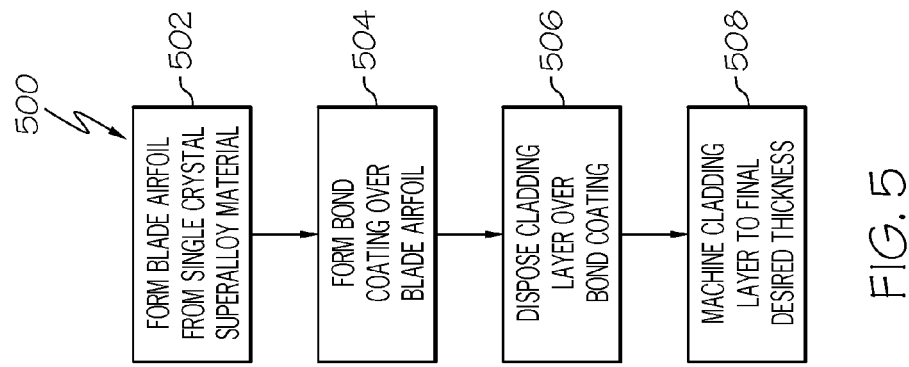
FIG. 5 is a flow diagram of a method of forming a blade, according to an embodiment.

FIG. 5 is a flow diagram of a method 500 of forming the cladding layer 250 over the blade 200, according to an embodiment. The method 500 includes forming a blade airfoil from a single crystal superalloy material, step 502. The single crystal superalloy material may comprise a base material having a formulation that is substantially similar to base material 248 of blade 200 described above. To fabricate the blade airfoil from the base material, vacuum-induction melting and casting processes may be used. In an embodiment, a thermal gradient solidification method may be employed. Here, molten metal having a composition of the base material (e.g., a metal, such as a nickel-based superalloy) is poured into a heat resistant ceramic mold having a shape corresponding to that of the final fabricated component. For example, the desired shape of the final fabricated component may be a blade airfoil. The mold and molten metal contained therein are placed in a furnace, induction heating coil or other heating device to melt the metal, and the mold and molten metal are gradually cooled. As a result, metal adjacent a cooler end of the mold initially solidifies, and an interface between the solidified and liquid metal gradually moves through the metal as cooling continues.

Thermal gradient solidification can be performed by placing a chill block adjacent one end of the mold and then turning off the heat source to allow the mold and molten metal to cool and solidify in a controlled desirable temperature gradient. Alternatively, the mold and molten metal can be gradually withdrawn from the heat source. The thermal gradient solidification process causes certain crystallographic orientations such as <001> to grow to the exclusion of other crystallographic orientations so that a single grain becomes dominant throughout the blade airfoil. Techniques may be employed to promote the formation of the single crystal orientation. For example, an oriented single crystal starting material can be positioned adjacent the metal first solidified so that the metal initially develops that orientation. In other embodiments, other techniques for forming the base material into the single crystal superalloy material may be used. For example, a liquid metal cooling process or casting process may be used to fabricate the airfoil. In this process, the base material is melted and poured into a ceramic mold placed inside a multi-zone heater. For solidification, the cast components are immersed at a constant rate into a liquid tin bath.

After the blade airfoil is formed, a bond coating is formed over a tip of the blade airfoil, step 504. In an embodiment, the bond coating may include a precious metal, such as platinum, palladium, or ruthenium. In another embodiment, the bond coating comprises pure platinum. As used herein, the term "pure platinum" may be defined as platinum having a purity of greater than about 99%. In accordance with an embodiment, the bond coating is applied directly to the surface of the blade airfoil. The bond coating may be applied to the blade airfoil by a plating process. For example, electroplating, electroless plating or other plating processes may be employed. In another embodiment, the bond coating may be deposited by a deposition process, such as by laser deposition, and the like. In still another embodiment, the bond coating may be applied to the tip by a sputtering process. In any case, the bond coating may be applied to a thickness in a range of from about 6 μm to about 14 μm, in an embodiment. In another embodiment, the bond coating may be thicker or thinner than the aforementioned range. Additionally, although described as being applied to the tip of the blade, the bond coating may be applied to other portions of the blade in preparation of forming other coatings, such as thermal barrier coatings or intermediate layers (e.g., thermal barrier coating 236 or intermediate layer 238), in other embodiments.

A cladding layer is disposed over the bond coating, step 506. According to an embodiment, the cladding layer comprises one or more of the platinum alloys as described above in relation to cladding layer 250. In an embodiment, the cladding layer is formed from the ZGS platinum alloy. The ZGS platinum alloy may be obtained as a sheet and machined to desired dimensions. The sheet may be selected for a thickness that is greater than a final desired thickness of the cladding layer. For example, in an embodiment in which the final desired thickness of the cladding layer is in a range of about 0.1 mm to about 0.4 mm, the thickness of the sheet may be in a range of about 0.2 mm to about 0.5 mm. In other embodiments, the sheet thickness may be greater or less than the aforementioned range. The sheet may be machined or cut to have a particular area depending on an area of the blade airfoil to be covered.

To adhere the base material, the ZGS platinum alloy sheet is bonded to the bond coating. In an embodiment, the sheet is diffusion bonded to the base material. For example, surfaces of the airfoil are cleaned to thereby remove contaminants, such as oxides, that may disrupt or interfere with the bonding. The cleaned airfoil is then contacted with the ZGS platinum alloy sheet, and a vacuum seal is affected therebetween. The two are held under a hot isostatic pressure load at an elevated temperature. Suitable pressures which may be applied to the airfoil and the sheet are in a range of about 15 to about 30 ksi. Suitable temperatures which may be employed for the diffusion bonding process may be in a range of between about 1035° C. to about 1110° C. Other forms of diffusion bonding may alternatively be employed such as by the application of an axial force in a vacuum atmosphere.

Next, the cladding layer is machined to a final desired thickness and shape, step 508. According to an embodiment, one or more blades, each including cladding layers formed in accordance with the aforementioned steps, are attached to a hub. The hub is positioned within a ring having an inner diameter that is substantially equal to a desired inner diameter dimension of a shroud component within which the blade will be disposed. The inner diameter of the ring may be slightly greater than a largest diameter of the hub measured from blade to blade. The hub is rotated at a speed that is equal to or greater than a speed at which the blade may be rotated when disposed in an engine. As the hub rotates, the tip of the blade airfoil is abraded by an inner surface of the ring resulting in the final desired thickness of the cladding layer. In another embodiment, grinding or another machining process may be employed to obtain the final desired thickness of the cladding layer. The blade airfoil may undergo further coating processes, in an embodiment. In other embodiments, the blade airfoil may be readied for inclusion into an engine component.

Accordingly, improved blades suitable for use in operating temperatures greater than 1150° C. have been provided. By including the cladding layer as part of the tip of the blade, thermal mechanical fatigue of the blades may be reduced and oxidation resistance improved and service lives of the blades may be improved over those of conventional blades. The improved blades may be more creep-resistant than blades formed from traditional superalloy and coating materials. In addition, the improved blades are relatively simple and inexpensive to manufacture.

While at least one exemplary embodiment has been presented in the foregoing detailed description of the inventive subject matter, it should be appreciated that a vast number of variations exist. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing an exemplary embodiment of the inventive subject matter. It being understood that various changes may be made in the function and arrangement of elements described in an exemplary embodiment without departing from the scope of the inventive subject matter as set forth in the appended claims.

What is claimed is:

1. A blade, comprising:
an airfoil including a convex suction side wall, a concave pressure side wall, a leading edge, a trailing edge, a root, and a tip, the convex suction side wall, the concave pressure side wall, and the tip each including interior surfaces that together define an internal cooling circuit, the airfoil comprising a single crystal superalloy; and
a cladding layer disposed over the tip, the cladding layer comprising a zirconia grain stabilized platinum alloy.

2. The blade of claim 1, wherein the single crystal superalloy comprises a nickel-based superalloy.

3. The blade of claim 1, further comprising a bond coating disposed between the airfoil and the cladding layer.

4. The blade of claim 3, wherein the bond coating comprises a noble metal.

5. The blade of claim 1, wherein the cladding layer has a thickness in a range of about 0.1 mm to about 0.4 mm.

6. The blade of claim 1, wherein the tip includes a parapet and the cladding layer is formed over the parapet.

7. The blade of claim 1, wherein the cladding layer is diffusion bonded to the tip.

8. The blade of claim 1, further comprising:
a thermal barrier coating disposed over the concave pressure side wall and not over the tip.

9. A turbine blade assembly comprising:
a turbine including a hub and a plurality of blades extending from the hub, each blade comprising:
an airfoil including a convex suction side wall, a concave pressure side wall, a leading edge, a trailing edge, a root, and a tip, the convex suction side wall, the concave pressure side wall, and the tip each including an interior surface defining an internal cooling circuit, the airfoil comprising a single crystal superalloy, and
a cladding layer disposed over the tip, the cladding layer comprising a zirconia grain stabilized platinum alloy; and
a shroud disposed around the turbine.

10. The turbine blade assembly of claim 9, wherein the single crystal superalloy comprises a nickel-based superalloy.

11. The turbine blade assembly of claim 9, further comprising a bond coating disposed between the airfoil and the cladding layer.

12. The turbine blade assembly of claim 11, wherein the bond coating comprises a noble metal.

13. The turbine blade assembly of claim 9, wherein the cladding layer has a thickness in a range of about 0.1 mm to about 0.4 mm.

14. The turbine blade assembly of claim 9, wherein the tip includes a parapet and the cladding layer is formed over the parapet.

15. The turbine blade assembly of claim 9, wherein the cladding layer is diffusion bonded to the tip.

16. The turbine blade assembly of claim 9, further comprising:
   a thermal barrier coating disposed over the concave pressure side wall and not over the tip.

17. A method of forming a blade, the method comprising the steps of:
   disposing a cladding layer over a tip of a blade airfoil, the cladding layer having an initial thickness and comprising a zirconia grain stabilized platinum alloy, and the blade airfoil comprising a single crystal superalloy, the step of disposing the cladding layer comprises diffusion bonding a sheet comprising the zirconia grain stabilized platinum alloy to the tip of the blade airfoil; and
   machining the cladding layer to a final desired thickness.

18. The method of claim 17, further comprising the step of forming a bond coating over the blade airfoil before the step of disposing.

19. The method of claim 17, wherein the step of machining comprises:
   attaching the blade airfoil including the cladding layer to a hub;
   positioning the hub in a ring; and
   rotating the hub to abrade the tip of the blade airfoil by an inner surface of the ring to result in the final desired thickness of the cladding layer.

* * * * *